United States Patent
Booth (12) United States Patent (10) Patent No.: US 6,345,307 B1
Booth (45) Date of Patent: Feb. 5, 2002

(54) METHOD AND APPARATUS FOR COMPRESSING HYPERTEXT TRANSFER PROTOCOL (HTTP) MESSAGES

(75) Inventor: Robert Charles Booth, Jamison, PA (US)

(73) Assignee: General Instrument Corporation, Horsham, PA (US)

(*) Notice: Subject to any disclaimer, the term of this patent is extended or adjusted under 35 U.S.C. 154(b) by 0 days.

(21) Appl. No.: 09/439,026

(22) Filed: Nov. 12, 1999

Related U.S. Application Data (60) Provisional application No. 60/131,807, filed on Apr. 30, 1999.

(51) Int. Cl.[7] .............................................. G06F 13/00
(52) U.S. Cl. ...................................................... 709/247
(58) Field of Search ................................ 709/200, 203, 709/217, 218, 219, 224, 227, 228, 230, 231, 232, 247

(56) References Cited

U.S. PATENT DOCUMENTS

| | | | | |
|---|---|---|---|---|
| 5,627,829 A | | 5/1997 | Gleeson et al. .............. | 370/230 |
| 5,751,968 A | * | 5/1998 | Cohen ......................... | 709/231 |
| 5,764,910 A | | 6/1998 | Shachar ....................... | 709/223 |
| 5,771,355 A | * | 6/1998 | Kuzma ......................... | 709/232 |
| 5,838,927 A | | 11/1998 | Gillon et al. ................ | 709/247 |
| 5,895,471 A | * | 4/1999 | King et al. ............... | 707/104.1 |
| 5,938,737 A | * | 8/1999 | Smallcomb et al. ......... | 709/247 |
| 5,953,503 A | * | 9/1999 | Mitzenmacher et al. .... | 709/203 |
| 5,956,490 A | * | 9/1999 | Buchholz et al. ............ | 709/245 |
| 6,029,200 A | * | 2/2000 | Beckerman et al. ......... | 709/226 |
| 6,032,197 A | * | 2/2000 | Birdwell et al. ............. | 709/247 |
| 6,088,803 A | * | 7/2000 | Tso et al. ..................... | 709/201 |
| 6,094,679 A | * | 7/2000 | Teng et al. ................... | 709/220 |
| 6,101,328 A | * | 8/2000 | Bakshi et al. ................. | 717/11 |

OTHER PUBLICATIONS

A.V. Aho et al., "Principles of Compiler Design," 1977, Addisson–Wesley, US XP002153382.
R. Fielding et al., "Hypertext Transfer Protocol, HTTP 1.1," Internet Request For Comments., XP002153381.
A.S. Tanenbaum, "Computer Networks.", Prentice–Hall, US XP002153383.
Sproull R.F. et al., "High–Level Protocols," Proceedings of the IEEE,US, IEEE. New York, vol. 66, No. 11, Nov. 1978, pp. 1371–1896, XP000813055.
"Simple Test of Compressing HTML Using ZLib," http://www.w3.org/Protocols/HTTP/Performance/Compression/HTMLCanon.html, Aug. 9, 1997.
"Compressed HTML Protocol Released," InternetNews.com, http://www.internetnews.com/wd–news/print/0,1089,10_55601,00.html, Nov. 10, 1998.

\* cited by examiner

*Primary Examiner*—Moustafa M. Meky
(74) *Attorney, Agent, or Firm*—Barry R. Lipsitz; Douglas M. McAllist

(57) ABSTRACT

A method and apparatus for compressing Internet protocol messages, such as HyperText Transport Protocol (HTTP) messages. Codewords (225) are provided for commonly occurring HTTP data elements, such as request lines, header lines, status lines, or portions thereof, such as method fields, URL fields, version fields, and status codes or messages. The codewords are used to provide a compressed HTTP message with a reduced amount of data relative to ASCII coding. If other data is included with the message, such as an entity body (e.g., a requested object such as an HTML page), the other data can be coded separately (215) and recombined (230) with the codewords for the HTTP data elements. The codewords may have reserved bits for providing specific information about the message. The amount of data that must be communicated, e.g., to or from a subscriber terminal (150), is thereby reduced. A message handler (340) decodes and processes the codewords. A compressed message handler 410 can be provided that processes/renders the compressed HTTP data (e.g., codewords) directly without decompressing them. The system is compatible with other compression techniques to provide even greater compression.

31 Claims, 4 Drawing Sheets

METHOD AND APPARATUS FOR COMPRESSING HYPERTEXT TRANSFER PROTOCOL (HTTP) MESSAGES

This application claims the benefit of U.S. Provisional Application No. 60/131,807, filed April 30, 1999, and entitled "Method And Apparatus For Coordinating And Filtering On Interactive And Broadcast Protocols In Broadband Network Environments."

BACKGROUND OF THE INVENTION

The present invention relates to a method and apparatus for compressing Internet protocol messages, such as Hypertext Transfer Protocol (HTTP) messages.

HTTP is a communication protocol used to make Hypertext Markup Language (HTML) and other applications available to users on the Web. An HTML file is stored in a directory that is accessible to a server. Such a server is typically a Web server which conforms to a Web browser-supported protocol such as Hypertext Transfer Protocol (HTTP).

Alternatively, HTML content may be stored at the head-end of a subscriber communication network, such as a cable/satellite television network. There is an increasing trend toward providing HTML content to subscribers via such networks due to the network's high speed data rates, the potential commercial benefits for tying in the HTML content with traditional television programming services, the expected convergence of telephone, television and computer networks, and the expected rise of in-home computer networks. The HTML content may be selected and provided directly by the headend, or the headend may merely act as a conduit in a high speed link between the subscriber and remote Web servers.

Servers that conform to other protocols, such as the File Transfer Protocol (FTP) or Gopher may also be accessed by an HTTP browser by using a proxy server. A proxy server is a type of gateway that allows a browser using HTTP to communicate with a server that does not understand HTTP, but which uses, e.g., FTP, Gopher or other protocols. The proxy server accepts HTTP requests from the browser and translates them into a format that is suitable for the origin server, such as an FTP request. Similarly, the proxy server translates FTP replies from the server into HTTP replies so that the browser can understand them.

Generally, the FTP file itself is not translated. FTP is a high level protocol for transferring files (as is HTTP). The translation occurs at the protocol level. For example, a client browser may send the HTTP request "GET ftp://www.myserver.com/somefile.txt HTTP/1.1". This would be translated at a proxy into an FTP "GET" request to be forwarded to the FTP origin server. The FTP response from the origin server back to the proxy (which has the requested file attached) is then translated at the proxy into an HTTP response that includes the attached file (e.g., as an object). The file being transferred is not translated or modified. However, in some cases, the browser may indicate that it can decode certain encoding or compression formats. Thus, the proxy may translate (encode or compress) the attached file before the file is transmitted to the client.

The proxy server can be a program running on the same machine as the browser, or a free-standing machine somewhere in a network that serves many browsers.

For example, the headend of a subscriber communication network may provide a proxy server function.

HTTP defines a set of rules that servers and browsers follow when communicating with each other. Typically, the process begins when a user clicks on an icon in an HTML page that is the anchor of a hyperlink, or the user types in a Uniform Resource Locator (URL). The URL contains a host name that is typically resolved into an IP address via a domain name system (DNS) lookup. A connection is then made to the host server using the IP address (and possibly a port number) returned by the DNS lookup. Next, the browser sends a request to retrieve an object from the server, or to post data to an object on the server. The server sends a response to the browser including a status code and the response data. The connection between the browser and server is then closed.

Generally, HTTP is implemented in a client program and a server program, which execute on different end systems and communicate with each other by exchanging HTTP messages. HTTP defines the structure of these messages and how the client and server exchange the messages.

However, due to the increasing popularity and expansion of the Internet, the amount of Internet traffic, including HTTP request and response messages, has also increased. Accordingly, the amount of processing power required by a user's terminal and browser, or other client or server, may not be sufficient to keep up with the flow of data. This can result in undesirable delays in obtaining requested data, such as HTML data, which is rendered on a user's screen, or other problems.

Moreover, an increasing amount of bandwidth for transmitting the HTTP messages is consumed, thereby reducing the available bandwidth for other uses, or taxing the capacity of the channel.

The HTTP messages data may be transmitted via a Public Switched Telephone Network (PSTN), via a cable or satellite television network, via a local wireless network, or via a combination of the above, for example.

In particular, HTTP messages typically include strings of ASCII characters. However, with eight bits (one byte) of data required for each character (including a letter, number, punctuation symbol, blank space, and carriage return), the amount of data in an HTTP message can be significant.

Accordingly, it would be desirable to provide a system for compressing HTTP or similar messages.

The system should reduce the amount of bandwidth required to communicate HTTP data to a browser, server or other processor.

The system should be suitable for use with existing networks over which Web data (e.g., HTML) is communicated.

The system should allow a browser that is implemented in a terminal (e.g., set-top box/decoder), in a subscriber television network, to directly process the compressed HTTP data without decompressing it.

The system should reduce the required processing power of a browser in a user terminal in a subscriber television network.

The system should provide a consistent and deterministic processing time for all compressed HTTP elements within a given message.

The system should be usable on a client/browser side or server side of a network.

The system should be usable on a proxy server that interfaces between a client/browser and a server, or other proxy servers.

The system should be compatible with networks that communicate Web data using a digital video communication protocol, such as MPEG-2.

The system should be compatible with networks that communicate Web data using the Transmission Control Protocol/Internet Protocol (TCP/IP).

The system should provide compression for current versions of HTTP, as well as derivations thereof and other analogous protocols, such as Gopher, FTP or Telnet.

The system should be compatible with other bit level compression techniques.

The present invention provides a system having the above and other advantages.

SUMMARY OF THE INVENTION

The present invention relates to a method and apparatus for compressing Internet, or any digital protocol messages, such as HTTP messages.

Codewords are provided for HTTP data elements (e.g., character strings) to reduce the amount of data, such as in an HTTP request or response message. The codewords may have reserved bits to distinguish specific data elements or to provide other information about the message to aid in processing. The technique is compatible with other compression techniques to provide even greater compression.

The invention provides a significant reduction in the amount of data that must be communicated, e.g., during a Web browsing session at a subscriber terminal. Additionally, the invention allows the use of a network processor or browser, e.g., in a subscriber terminal, to process the compressed HTTP codewords directly without decompressing them. This can provide significant savings in processing time and complexity.

Additionally, each codeword can have the same length and therefore generally takes the same amount of time to process, so the processing time becomes more deterministic. Alternatively, variable length codewords can be provided, such as with an entropy coding scheme.

A particular encoding method for processing an Internet protocol message, such as an HTTP message, includes the step of providing a plurality of codewords for coding a corresponding plurality of recognizable data elements of the protocol. Each of the recognizable data elements comprises a string having a plurality of characters (e.g., letters, numbers, and/or other symbols). The digital protocol message is parsed to locate data elements thereof corresponding to the recognizable data elements. A corresponding one of the codewords is output for each of the recognizable data elements located in the digital protocol message to provide the message in a compressed format.

A corresponding decoding method includes the step of providing a plurality of data elements of the protocol for decoding a corresponding plurality of the codewords. The compressed message is parsed to locate the codewords thereof. Next, the respective data elements are provided for each corresponding codeword located to provide the digital protocol message in an uncompressed format. The uncompressed data can then be processed by a conventional HTTP message handler.

Optionally, the compressed HTTP messages can be decoded directly, without decompression. In particular, such a method includes the step of parsing the compressed message to locate the codewords thereof. Next, the located codewords are provided to a compressed protocol data message handler for processing thereat in accordance with the protocol without recovering the corresponding data elements. Such a message handler can be designed using known hardware and/or software techniques to directly recognize and process the compressed HTTP data (e.g., codewords).

In addition, an optimal solution provides the capability to cache (e.g., temporarily store) the compressed data in a proxy server for content that is accessed frequently by subscriber terminals.

Corresponding apparatuses are also disclosed.

DETAILED DESCRIPTION OF THE INVENTION

The present invention relates to a method and apparatus for compressing Internet, or any digital protocol messages, such as HTTP messages.

A brief description of HTTP which is relevant to the present invention follows.

A Web page or document consists of objects or files, such as a HTML file, a JPEG image, a GIF image, a Java applet, an audio clip, etc.—that are each addressable by a single URL. A Web server houses Web objects which are addressable by a URL. Web servers also implement the server side of HTTP.

HTTP defines how Web clients (e.g., browsers) request Web pages from servers (e.g., Web servers) and how servers transfer Web pages to clients. Specifically, when a user requests a Web page (e.g., clicks on a hyperlink), the browser sends HTTP request messages for the objects in the page to the server. The server receives the requests and responds with HTTP response messages, which include the objects. Most browsers and Web servers implement version HTTP/1.0 (defined in RFC 1945) or the more recent version HTTP/1.1 (RFC 2068).

Both HTTP versions run on top of the Transmission Control Protocol (TCP) layer. The HTTP client first initiates a TCP connection with the server. Once the connection is established, the browser and the server access TCP through their socket interfaces. On the client side, the socket interface is the "door" between the client process and the TCP connection; on the server side, it is the "door" between the server process and the TCP connection. The client sends HTTP request messages into its socket interface and receives HTTP response messages from its socket interface.

Similarly, the HTTP server receives request messages from its socket interface and sends response messages into the socket interface.

HTTP messages are not typically displayed to the end user, unlike HTML data.

The HTTP specifications RFC 1945 and RFC 2068 define the HTTP message formats. There are two types of HTTP messages, namely request messages and response messages.

A typical HTTP request message is as follows:

GET /somedir/page.html HTTP/1.1

User-agent: Mozilla/4.0

Accept: text/html, image/gif, image/jpeg

Accept-language:en (carriage return, line feed)

Note that a name/value pair designates information such as HTTP/1.1 or Mozilla/4.0. Each line or portion of a message line is considered to be a data element or string of characters. For example, "GET" and "HTTP/1.1" can be considered to be data elements or strings of characters. A character is any number, letter or symbol, such as an ASCII or Unicode character.

Although this particular request message has five lines, a request message can have many more lines, or as little as one line. The first line is the request line, while the subsequent lines are header lines. The request line has three fields, namely a method field, a URL field, and an HTTP version field. The method field can have different values, e.g., GET, POST, and HEAD. The GET method is most common, and is used when the browser requests an object, with the object identified in the URL field. In this example, the browser is requesting the object "/somedir/page.html".

The browser doesn't have to specify the host name in the URL field since the TCP connection is already connected to the server. The HTTP version in this example is HTTP/1.

The "User-agent:" header line informs the server of the user agent, i.e., the browser type that is making the request. Here, the user agent is "Mozilla/4.0", a Netscape(tm) browser.

The "Accept:" header line tells the server the type of objects the browser is prepared to accept. In this case, the client is prepared to accept HTML text, GIF images or JPEG images. The "Accept-language:" header indicates that the user prefers to receive an English ("en") version of the object.

In addition to a request line and header lines, an HTTP request message may include an "Entity Body" when the POST method is used. The HTTP client uses the POST method when the user fills out a form—for example, when a user gives search words to a search engine. The HEAD method is similar to the POST method. When a server receives a request with the HEAD method, it responds with an HTTP message but it leaves out the requested object. The HEAD method is often used by HTTP server developers for debugging.

The above request message includes 122 characters, including spaces, and a carriage return and line feed after each line, and therefore requires 122 bytes to be coded as ASCII characters.

An example scheme for assigning codewords to the different data elements of the request message is shown in Table 1. The codewords are given in hexadecimal (base 16), unless indicated otherwise. The binary (base 2) equivalent is given where specific bit positions within the codeword have specific meanings. The equivalent decimal value (base 10) is given when meaningful. The table provides an example only, and many variations are possible.

With conventional ASCII coding, eight bits of data are required for each character (including each letter, number, punctuation symbol, blank space, and carriage return). Since the message has 122 characters, 122 bytes of data are required.

However, with the coding scheme of Table 1, only 44 bytes are needed, for a savings of 64%. In a given sequence of communications between a user and a server (e.g., in an Internet session), the amount of savings with the present invention increases according to the length and frequency of occurrence of the HTTP messages.

TABLE 1

| Codeword: | Data element/explanation: |
|---|---|
| (line 1) | |
| $02_{16} = 00000010_2$ | MSB of binary codeword designates a request message if = 0 or a response message if = 1 (here the MSB is 0); next 7 bits indicate "GET" method |
| 03 | indicates that an absolute path or text URL follows |
| $12_{16} = 18_{10}$ | indicates the length in bytes of the absolute path or text URL |
| 2F, 73, 6F, 6D, 65, 64, 69, 72, 2F, 70, 61, 67, 65, 2E, 68, 74, 6D, 6C | ASCII character codes for path "/somedir/page.html" |
| $0002_{16} = 2_{10}$ | HTTP/ |
| 03 | 1.1 |
| $03_{16} = 3_{10}$ | total number of header lines that follow |
| (line 2) | header type - 1st bit reserved, next 2 bits indicate |
| $51_{16} = 1010001_2$ | header type (01 = general, 10 = request, 11 = entity), next 5 bits indicate header field |
| $03_{16} = 3_{10}$ | number of bytes that follow for that header type |
| 01 | header field ("User-agent:") |
| 07 | ("Mozilla/") |
| 04 | ("4.0") |
| (line 3) | header field (i.e., "Accept:") |
| $41_{16} = 01000001_2$ | |
| 07 | number of bytes that follow for that field (i.e., 7 bytes) |
| 03 | number of entity type/subtype pairs that follow (i.e., 3 pairs) |
| 02 | text/ |
| 03 | html, |
| 06 | image/ |
| 02 | gif, |
| 06 | image/ |
| 03 | jpeg |
| (line 4) 44 | header field (i.e., "Accept-language:") |
| $03_{16} = 3_{10}$ | number of bytes that follow for that header type |
| $01_{16} = 1_{10}$ | number of language ranges that follow |
| $01_{16} = 00000001_2$ | MSB of binary codeword designates if parameters are also present with the language range, if = 0 not present if = 1 present (here the MSB is 0); next 7 bits indicate the number of number of bytes that follow, each corresponding byte specifying a language range tag |
| 05 | en (i.e., English language range tag) |

A typical HTTP response message is as follows:

HTTP/1.1 200 OK

Connection: close

Date: Thu., Aug. 06, 1998 12:00:15 GMT

Server: Apache/1.3.0 (Unix)

Last-Modified: Mon., Jun. 22, 1998 09:23:24 GMT

Content-Length: 6821

Content-Type: text/html (carriage return, line feed)

(Entity body. . .

The response message has three parts, namely an initial status line, six header lines, and the entity body, which contains the requested object itself. The status line has three fields, namely a protocol version field ("HTTP/1.1"), a status code ("200"), and a corresponding status message ("OK"—e.g., the server has found and is sending the requested object).

The server uses the "Connection: close" header line to tell the client that it is going to close the connection after sending the message. The "Date:" header line indicates the time and date when the HTTP response was created and sent by the server. The "Server:" header line indicates that the message was generated by an Apache Web server. The "Last-Modified:" header line indicates the time and date when the object was created or last modified. The "Content-Length:" header line indicates the number of bytes in the object being sent. The "Content-Type:" header line indicates that the object in the entity body is HTML text.

The HTTP specification defines many other header lines that can be inserted by browsers, Web servers and network cache servers.

An example scheme for assigning codewords to the different data elements of the response message is shown in Table 2, whose format is analogous to that of Table 1. The table provides an example only, and many variations are possible.

Similarly, for the above-mentioned HTTP response message ("HTTP/1.1 200 OK . . ."), with conventional ASCII coding, 197 bytes are required. However, with the coding scheme of Table 2, only 47 bytes are needed, for a savings of 76%.

TABLE 2

| Codeword: | Data element/explanation: |
| --- | --- |
| (line 1) | |
| $02_{16} = 10000000_2$ | MSB of binary codeword designates a request message if = 0 or a response message if = 1 (here the MSB is 1); next 7 bits indicates the class code (i.e., the "00" portion of "200") of the response. |
| $1A_{16} = 00010010_2$ | first 5 bits indicates a reason length (i.e., 2), last 3 bits indicate class type (i.e., $010_2$ = success or "2" of the "200" |
| $0002_{16} = 2_{10}$ | HTTP/ |
| 03 | 1.1 |
| $4F4B_{16}$ | reason phrase "OK" |
| 06 | number of header lines that follow |
| (line 2) | header type - 1st bit reserved, next 2 bits indicate |
| $22_{16} = 00100010_2$ | header type (01 = general, 10 = response, 11 = entity), next 5 bits indicate header field (i.e., 00010 = "Connection:") |
| 01 | number of bytes that follow for the header field |
| 01 | header field "close" |
| (line 3) | header type - 1st bit reserved, next 2 bits indicate |
| $23_{16} = 00100011_2$ | header type (01 = general), next 5 bits indicate header field (i.e., 00011 = "Date:") |
| 06 | number of bytes that follow for the header field |
| $86_{16} = 10000110_2$ | The first 3 bits indicate the text day (i.e., "Thu," = 100). The last 5 bits indicate the numeric day of the month (i.e., "06" = 00110). |
| $88_{16} = 10001000_2$ | The MSB indicates if the time that follows is A.M. (0) or P.M. (1); next 3 bits are reserved; last 4 bits indicate the month (i.e., "Aug" = 8) |
| $07CE_{16} = 1998_{10}$ | year |
| $000F_{16} = 000000000001111_2$ | The first 4 bits indicate the hour with valid values ranging between 0 and 11 and zero representing 12 if P.M. bit is set (i.e., "12:" = 0000); next 6 bits indicate minutes (i.e., "00:" = 000000); last 6 bits indicating seconds i.e., "15" = 001111 |
| (line 4) | header type - 1st bit reserved; next 2 bits indicate |
| $46_{16} = 01000110_2$ | header type (01 = general); next 5 bits indicate header field (i.e., 00110 = "Server:") |
| 08 | number of bytes that follow for the header field |
| 02 | Number of products or comments that follow in the header |
| $02_{16} = 00000010_2$ | MSB indicates product if = 0 or comment if = 1 (here the MSB is 0), last 7 bits indicate the product type (i.e., "Apache/" = 2) |
| 23 | Indicates product version i.e., "1.3.0" |
| $84_{16} = 10000100_2$ | MSB indicates product (0) or comment (1) (here the MSB is 1); last 7 bits indicate the comment length in bytes (i.e., $100_2$ = 4 bytes). |
| 55, 6E, 69, 78 | ASCII for "Unix" |
| (line 5) | header type - 1st bit reserved; next 2 bits indicate |
| $6C_{16} = 01101100_2$ | header type (11 = entity); next 5 bits indicate header field (i.e., 01100 = "Last-Modified:") |
| 06 | number of bytes that follow for the header field |
| $36_{16} = 00110110_2$ | The first 3 bits indicate the text day (i.e., "Mon," = 001) The last 5 bits indicate the numeric day of the month (i.e., "22" = 10110) |
| $06_{16} = 00100011_2$ | The MSB indicates if the time that follows is A.M. or P.M. time A.M. if = 0 or P.M. if = 1 (here the MSB is 1); next 3 bits are reserved, last 4 bits indicates the month (i.e., "Aug" = 8) |

TABLE 2-continued

| Codeword: | Data element/explanation: |
| --- | --- |
| $07CE_{16} = 1998_{10}$ | year |
| $95D8_{16} = 100101011 1011000_2$ | The first 4 bits indicate the hour with valid values ranging between 0 and 11 and zero representing 12 if P.M. bit is set. (i.e., "09:" = 1001), next 6 bits indicating minutes (i.e., "23:" = 010111), last 6 bits indicating seconds (i.e.., "24" = 011000) |
| (line 6) 65 | header type - 1st bit reserved; next 2 bits indicate header type (11 = entity); next 5 bits indicate header field (i.e., 001 01 = "Content-Length:") |
| 04 | number of bytes that follow for the header field |
| $00001AA5_{16} = 6821_{10}$ | "6821" |
| (line 7) 69 | header type - 1st bit reserved; next 2 bits indicate header type (11 = entity); next 5 bits indicate header field (i.e. 01001 = "Content-Type:") |
| 02 | number of bytes that follow for the header field |
| 02 | text/ |
| 03 | html |

Note that various characters can be assumed from the context by the decoder and need not be explicitly coded. For example, with the string "(Unix)", the ASCII codes for "("and")" need not be provided if the decoder knows that these characters are to be added back for comments.

Specific techniques for compressing HTTP data elements are discussed below.

Figure 1:
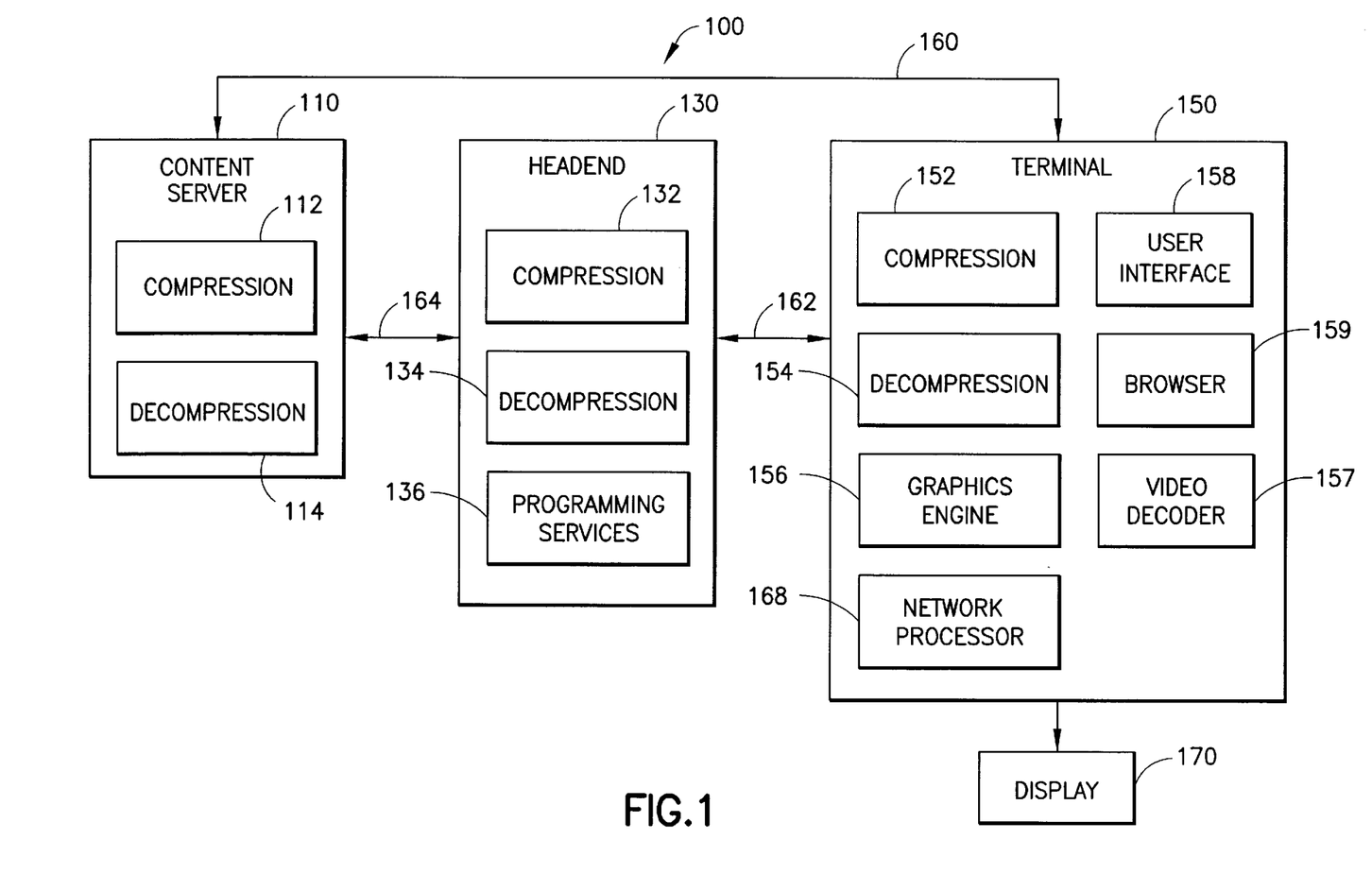
FIG. 1 illustrates a subscriber television network that uses HTTP compression in accordance with the present invention.

FIG. 1 illustrates a subscriber television network that uses HTTP compression in accordance with the present invention.

Although the invention may be implemented in a variety of networks, it is particularly suitable for use in subscriber television networks that allow users (subscribers) to access HTML data, such as on the Internet. Typically, the user can access HTML content, such as Web pages, that is delivered via a downstream channel on the network. For example, a variety of techniques can be used to deliver HTML data via cable and satellite television networks. The user is typically provided with an upstream link via a conventional telephone network to enter commands, such as a URL address to request to view a particular Web page. Some cable television networks have an upstream user data channel that can be used for this purpose.

The HTTP request message is received at a headend or other central location, and forwarded to a proxy server or the content server that is designated by the URL. The content returned by the proxy or content server to the headend is then prepared for transport to the user with an HTTP response message. For example, the HTTP message and accompanying HTML data may be encapsulated in digital MPEG-2 packets that are in-band or out-of-band with programming service data (e.g., television programs, audio, etc.).

Or, the HTTP message and accompanying HTML data may be carried in the vertical blanking interval (VBI) of a digital or analog television signal.

The invention is compatible with essentially any communication technique for providing HTTP messages in upstream and/or downstream paths.

The HTTP messages and the content are subsequently recovered at the user's terminal and the content is rendered by a browser application or graphics processing engine for viewing on a video monitor, such as a television or computer monitor.

The headend may act as a proxy server when interacting with other proxy servers or the content server, e.g., when the URL request from the user is in a format that is not compatible with the content server. In this case, the headend proxy server converts the HTTP request into the necessary format, and converts the message and content returned by the content server into a format that the user's terminal can understand.

FIG. 1 shows an example embodiment wherein a network 100 includes a content server 110, a headend 130, and a user terminal 150. The content server 110 is representative of any number of available origin or proxy servers that store HTML data in a computer network such as the Internet.

Similarly, the user terminal 150 is representative of a population of terminals that can receive broadcast signals from a common service provider, such as the headend 130 in a cable/optical fiber or satellite television network.

An optional upstream channel 160, such as a conventional telephone link and modems, allows the terminal 150 to communicate directly with content servers.

A channel 162 is used by the headend 130, e.g., to broadcast programming services from function 136 (such as television programs, weather and stock data, shop at home data and the like) to a subscriber terminal population, including the example terminal 150. HTTP messages and HTML content are also communicated to the terminal 150 via the one-way or bi-directional channel 162. Correspondingly, HTTP messages are communicated from the terminal 150 to the Headend 130 via a bi-directional implementation of channel 162. The channel 162 may physically be implemented as coaxial cable, a satellite link, optical fiber, local wireless channel (such as multi-point microwave distribution—MMDS), or a telephone link for example, or a combination thereof.

A channel 164 allows the headend 130 and the example content server 110 to communicate with each other. This channel typically is implemented as a telephone link or Ethernet network. The server 110 is generally remote from the headend 130, although it is possible for the headend to store HTML content on a local storage media, such as digital video disc or magnetic tape, or on a hard drive of a file server. Known networking architectures are used to provide the channel 164.

The headend 130 may act also as a proxy server and cache the content locally. The content may also be selected to correspond to the programming services. In this case, a graphic may be overlaid with a television program to inform the user that related HTML content is available. For example, during a televised baseball game, the user can be directed to a Web site for baseball scores.

In some cases, the entire local content may be continually or periodically broadcast, e.g., on the same channel (or multiplex) as the programming service, or on a separate channel (or multiplex). This may occur on one-way only networks where the user has no upstream link to the headend. In this case, the selection of the desired HTML content with the accompanying HTTP messages then occurs at the user terminal 150.

Known conditional access techniques may be used to provide access to the HTML content on a fee basis.

The present invention is suitable with any of the above scenarios.

In the example of FIG. 1, it is assumed that the user has some upstream channel (either 160 or 162) to cause selected HTML content to be recovered from the content server 110 and provided to the terminal 150 via the headend 130 or directly via channel 160. In the case of channel 160, the content would typically be sent directly back to the terminal via channel 160.

The content server 110, headend 130, and terminal 150 are shown with HTTP compression functions 112, 132 and 152, respectively, and HTTP decompression functions 114, 134 and 154, respectively. Not all of these functions are required, however.

The compression function 152 is used to compress HTTP data (such as a request message) transmitted from the terminal 150 to the headend 130 or the content server 110. The decompression function 154 is used to decompress compressed HTTP data (such as a response message) received from the headend 130 or content server 110.

The compression function 132 is used to compress HTTP data transmitted from the headend 130 to the content server 110 or the terminal 150. The decompression function 134 is used to decompress compressed HTTP data received from the content server 110 or the terminal 150.

The compression function 112 is used to compress HTTP data transmitted from the content server 110 to the headend 130 or the terminal 160. The decompression function 114 is used to decompress compressed HTTP data received from the headend 130 or the terminal 150.

The terminal 150 includes a user interface 158 for receiving user commands, e.g., via a keyboard or infra-red remote control. For example, the user may click on a graphic on the display 170 that is associated with a URL, to initiate the downloading of the corresponding HTML content to the terminal 150 via an upstream HTTP request message.

When the terminal 150 is requesting data from the content server 110 via the headend 130, the terminal 150 may be considered to be a client, while the headend 130 is a proxy server, and the content server 110 is an origin server.

A browser 159 may be a full-featured browser application such as used on a personal computer, or a minimal browser that has only some basic functionality, such as text rendering or limited graphics rendering capabilities. The browser 159 is used in conjunction with the graphics engine 156 for rendering text and images for the display 170 from the HTML content received at the terminal 150.

A video decoder 157 may be used for rendering video, associated with compressed (or uncompressed) scripting language content, for the display 170.

A network processor 168 may process compressed http data without decompressing it. The processor 168 can be designed to directly recognize codewords that are assigned to HTTP data as discussed herein.

The display 170 may be a television screen or a video monitor for a PC, for example.

The processing power of the terminal 150, including, but not limited to, the central processor type, graphics engine type, and video decoder type, within said terminal will dictate the level of features that can be supported by the browser 159.

Figure 2:
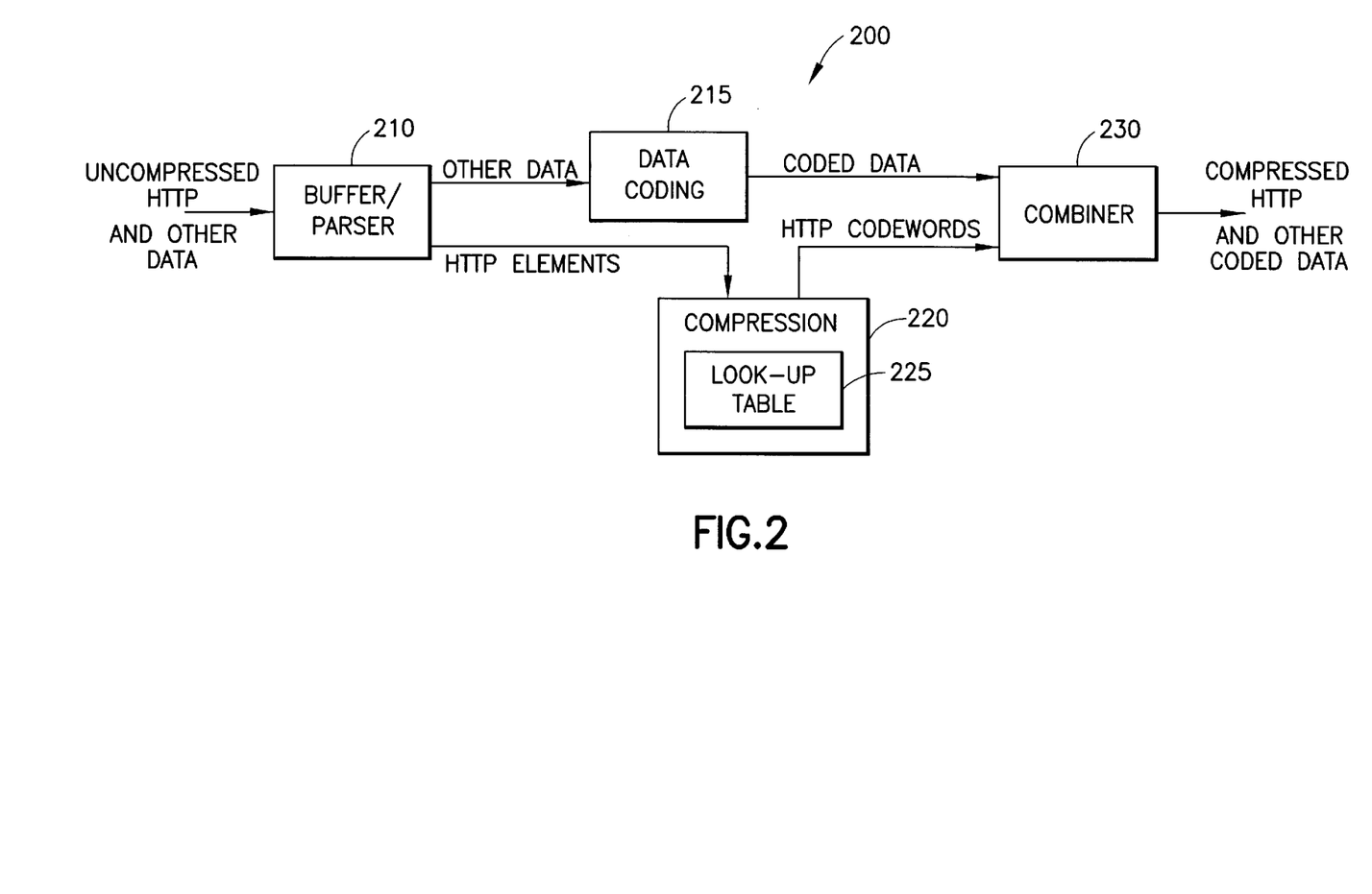
FIG. 2 illustrates HTTP compression in accordance with the present invention.
Figure 3:
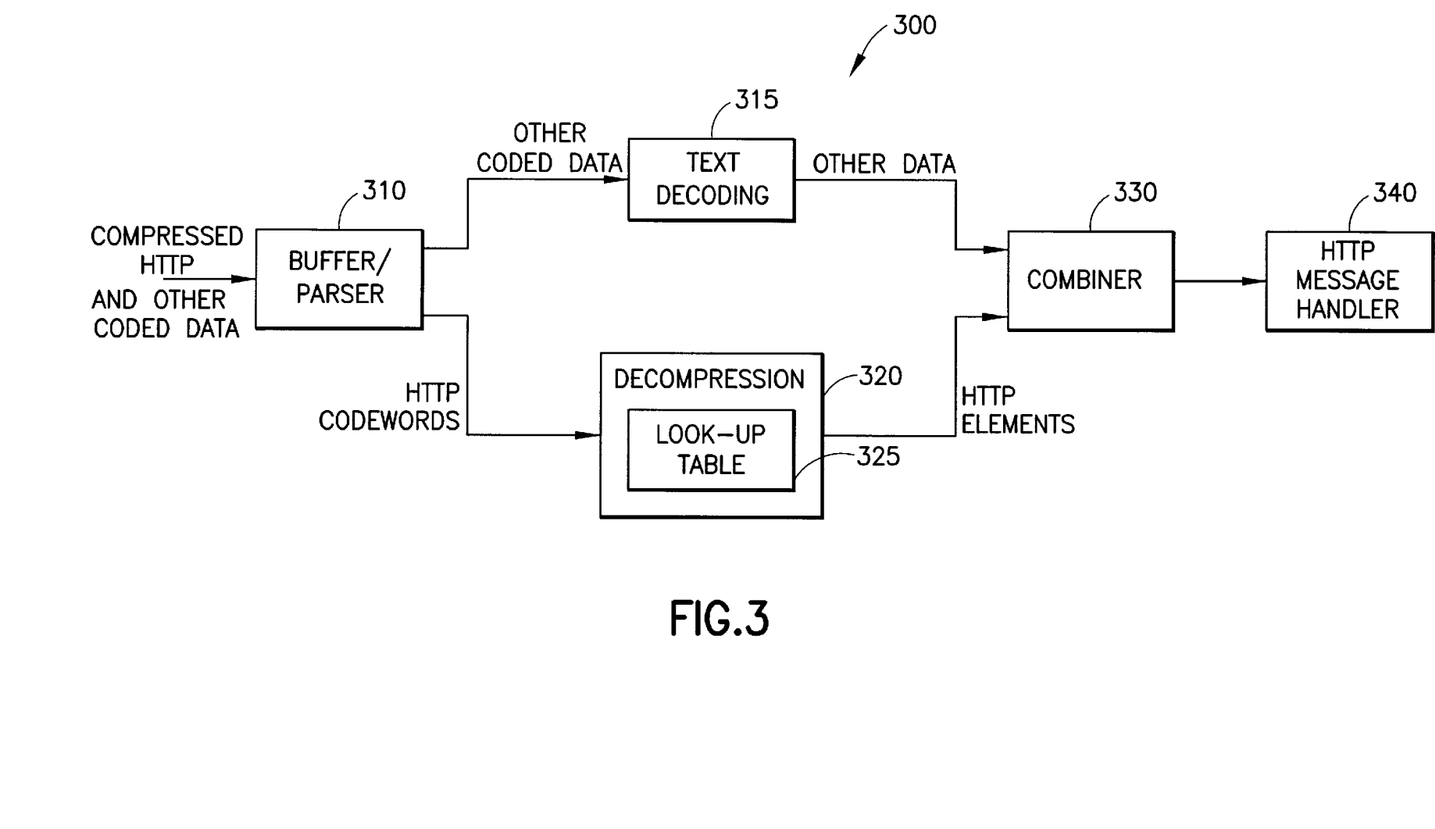
FIG. 3 illustrates HTTP decompression in accordance with the present invention.

The compression functions 112, 132 and 152 can implement a compression scheme as shown in FIG. 2, while the decompression functions 114, 134 and 154 can implement a decompression scheme as shown in FIG. 3.

Moreover, the mentioned compression and decompression functions can optionally provide compression and decompression, respectively of HTML data, as disclosed in commonly-assigned U.S. patent application Ser. No. 09/393,835, filed Sep. 10, 1999, still pending and entitled "Method and Apparatus for Compressing Scripting Language Content".

FIG. 2 illustrates HTTP compression in accordance with the present invention. The compression function 200 corresponds to the compression functions 112, 132, 152 of FIG. 1. A buffer/parser 210 receives uncompressed HTTP messages and, optionally, other data. For example, as discussed, an HTTP request message, such as a GET method, does not have an entity body with additional data, while a POST method message does have additional data. Typically, an HTTP response message does have additional data in the entity body, such as an object that was requested by the user. This additional data may comprise text and graphics data, for example, such as from a Web page.

The other data, if present, is parsed and provided to a conventional data coding function 215 to provide coded data, e.g., such as coded text in the form of the original ASCII text data prefixed with a set of fields. The said set of fields may contain an identifier and length fields indicating to the combiner 230 that the following amount of original ASCII text data, does not contain compressed data elements.

The HTTP data elements, which can comprise a line of the HTTP message, or a field (such as a method field, URL field, or version field) or other code or message (such as a status code or status message) within a line, and so forth, are parsed and provided to a compression function 220, which optionally has a look-up table 225 that can be implemented using known techniques. The look-up table 225 associates a codeword with each HTTP data element. For example, refer to Tables 1 and 2, discussed previously. The length of the codeword should be selected based on the number of different elements that are to be coded. An eight- or sixteen-bit codeword (two bytes) is believed to be appropriate to handle the existing messages while also allowing for future growth.

Moreover, it is possible to reserve one or more of the bits in specific positions in the codeword to provide specific information. As an example only, the first three bits of the codeword can designate the method field (e.g., 000 for GET, 001 for POST, 010 for HEAD, etc.). The next two bits can designate the version field (e.g., 00 for HTTP/1.0, and 01 for HTTP/1.1).

In the header lines, commonly-used data elements (e.g., "Connection:", "close", "User-agent:", "Accept:", "Accept-language" and so forth can be replaced by codewords. A codeword can also be assigned to longer strings of data elements, e.g., "Connection: close", "Accept-language:en", and "200 OK".

Generally, for a given codeword length, there are a limited number of different codewords to represent different data elements. The codeword length and the number of reserved bits in each codeword should be selected accordingly.

Specific bits may designate that a codeword is the first or last codeword of an HTTP message, or that the message is a request or response message.

In addition, other bits may designate the length of subsequent elements or sub-elements that follow in a given message.

It is not required to have a codeword for all possible data elements in the HTTP message. For example, in a normal Internet session, the URL can vary among numerous possible strings, so the codeword would have to be very large to designate each URL. In this case, the URL therefore would simply be transmitted using ASCII codewords for each character. When only a limited number of URLs are used, such as when a limited amount of HTML content is provided to users in a subscriber network via a headend, the assigning of codewords in accordance with the present invention may be appropriate.

Codewords, or an index number, specified by a proxy server may also be used when it is desired to code one, or small number of URLs, such as a "home" URL, and a number of popular URLs, from among a very large number of possible URLs.

For each compressible HTTP data element, a codeword is output from the compression function 220 and provided to a combiner 230 to be combined with the other coded data, if any, in the appropriate sequence to provide compressed HTTP data in accordance with the present invention. This data comprises the HTTP codewords from the compression function 220.

Note that additional, known compression techniques, such as the Lempel-Ziv algorithm and Huffman coding, can be used with the compressed HTTP data output from the combiner 230, or for the coded data alone or the HTTP codewords alone. Moreover, associated video/audio data may be compressed using known techniques.

FIG. 3 illustrates HTTP decompression in accordance with the present invention. The decompression function 300 corresponds to the decompression functions 114, 134, 154 of FIG. 1.

Here, the compressed HTTP and other coded data, if present, are received at a buffer/parser 310. The coded data is provided to a decoding function 315 to recover the other data (e.g., text or graphics), which is then provided to a combiner 330. The HTTP codewords are provided to a decompression function 320. A look-up table 325 at the decompression function 320 associates an HTTP data element with each received codeword. The look-up table 325 may be the inverse of the look-up table 225. The corresponding elements are output to the combiner 330 to form the uncompressed HTTP data and other data. The output of the combiner 330 is routed for appropriate processing, e.g., to the browser 159 in the terminal 150, or to the appropriate processor at the headend 130 or content server 110.

Figure 4:
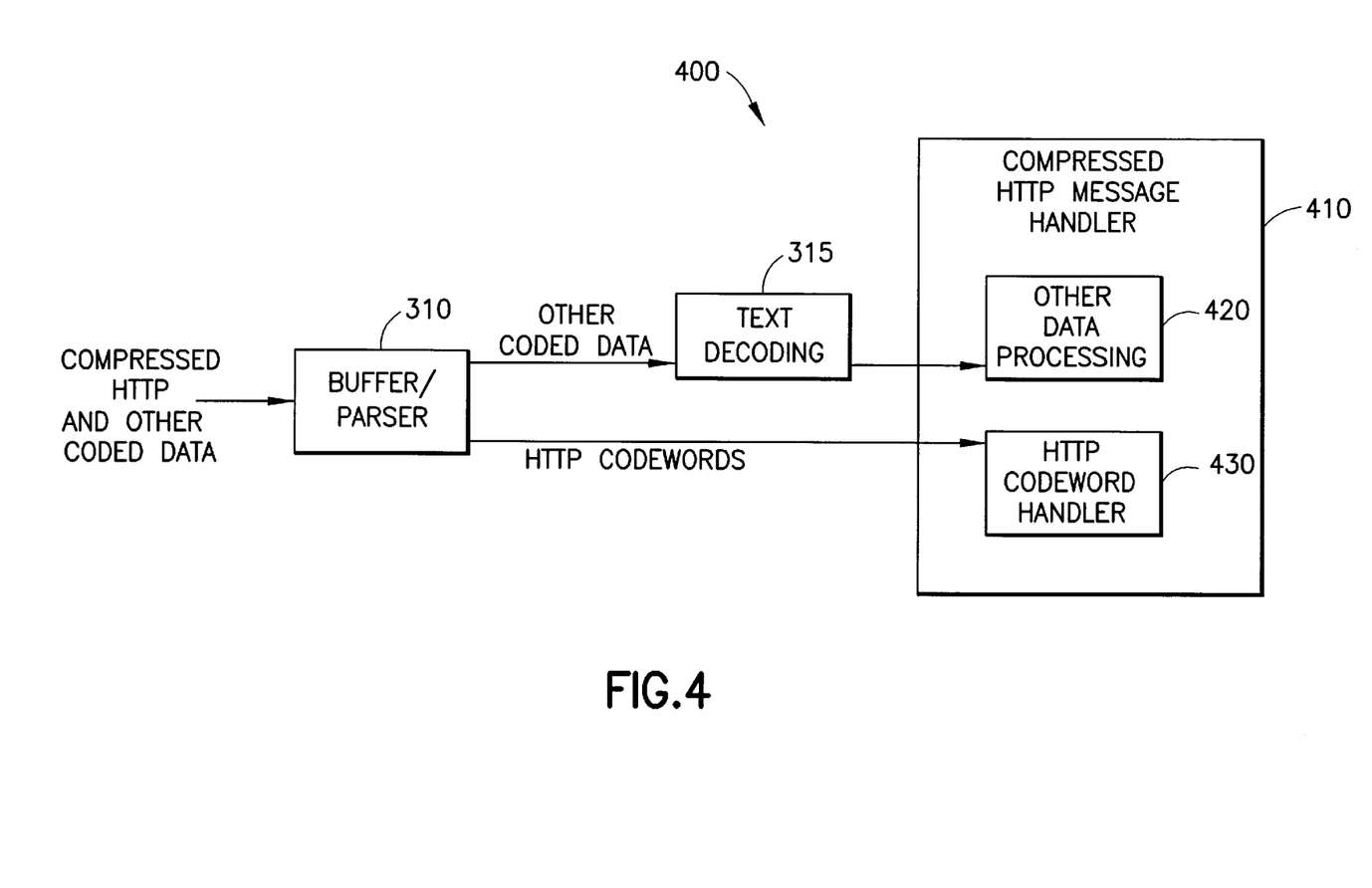
FIG. 4 illustrates processing of compressed HTTP data without decompression in accordance with the present invention.

FIG. 4 illustrates processing of compressed HTTP data without decompression in accordance with the present invention. Here, a decoder 400 includes a compressed HTTP message handler 410 with an HTTP codeword handler 430 for directly processing the codewords. A function 420 is also provided for processing other data, which may include entity data, HTTP strings for which no codeword is provided, and so forth.

Accordingly, it can be seen that the present invention provides a method and apparatus for compressing HTTP messages. Codewords are provided for HTTP data elements to reduce the amount of data in an HTTP request or response message. Moreover, the codeword may have reserved bits to distinguish specific data elements or to provide other information about the message to aid in processing. The technique is compatible with other compression techniques to provide even greater compression.

The invention provides a significant reduction in the amount of data that must be communicated, e.g., during an Internet session at a subscriber terminal. Additionally, the invention allows the use of a network processor 168 or browser, e.g. in a subscriber terminal to process the compressed HTTP data (e.g., codewords) directly without decompressing them. This can provide significant savings in processing time and complexity.

Additionally, each codeword may have the same length and therefore generally takes the same amount of time to process, so the processing time becomes more deterministic.

The techniques of the present invention may be implemented using any known hardware, software and/or firmware techniques.

Although the invention has been described in connection with various specific embodiments, those skilled in the art will appreciate that numerous adaptations and modifications may be made thereto without departing from the spirit and scope of the invention as set forth in the claims.

For example, while the invention was discussed in connection with a cable or satellite television broadband communication networks, it will be appreciated that other networks such as local area networks (LANs), metropolitan area networks (MANs), wide area networks (WANs), internets, intranets, and the Internet, or combinations thereof, may be used.

Moreover, the invention is suitable for use in compressing messages in other Internet protocols besides HTTP.

What is claimed is:

1. A method for processing a digital protocol message which includes a plurality of recognizable data elements and data other than the recognizable data elements, comprising the steps of:

(a) providing a plurality of codewords for coding a corresponding plurality of the recognizable data elements of the protocol;

each of said recognizable data elements comprising a string having a plurality of characters;

(b) parsing the digital protocol message to locate data elements thereof corresponding to said recognizable data elements and to locate said other data;

(c) outputting a corresponding one of said codewords for each of the recognizable data elements located in the digital protocol message to provide the message in a compressed format;

(d) coding the other data to provide coded data; and (e) combining the coded data with the codewords in the compressed message.

2. The method of claim 1, comprising the further steps of:
   (f) parsing the compressed message to separate the coded data from the codewords thereof;
   (g) decoding the coded data to recover the other data;
   (h) providing the respective data elements for each corresponding codeword obtained in said step (f); and
   (i) combining the data elements provided in said step (h) with the recovered other data to provide an uncompressed message.

3. The method of claim 1, comprising the further step of:
   communicating the compressed message from at least one of a content server and a headend to at least one subscriber terminal in a communication network.

4. The method of claim 1, wherein:
   the compressed message is communicated according to at least one of a Moving Picture Experts Group (MPEG) transport scheme and a Transmission Control Protocol/Internet Protocol (TCP/IP) transport scheme and an ALOHA protocol transport scheme and an Asynchronous Transfer Mode (ATM) transport scheme.

5. The method of claim 1, comprising the further step of:
   communicating the compressed message from a subscriber terminal to at least one of a content server and a headend in a communication network.

6. The method of claim 5, wherein:
   the compressed message is communicated according to at least one of a Moving Picture Experts Group (MPEG) transport scheme and a Transmission Control Protocol/Internet Protocol (TCP/IP) transport scheme and an ALOHA protocol transport scheme and an Asynchronous Transfer Mode (ATM) transport scheme.

7. The method of claim 1, comprising the further step of:
   communicating the compressed message to a subscriber terminal in a communication network; and
   processing the compressed message at the terminal without recovering the corresponding data elements.

8. The method of claim 7, wherein:
   the compressed message is communicated according to at least one of a Moving Picture Experts Group (MPEG) transport scheme and a Transmission Control Protocol/Internet Protocol (TCP/IP) transport scheme and an Asynchronous Transfer Mode (ATM) transport scheme.

9. The method of claim 1, comprising the further steps of:
   (f) parsing the compressed message to locate the codewords thereof; and
   (g) providing the respective data elements for each corresponding codeword obtained in said step (f).

10. The method of claim 1, wherein:
    the protocol message is a HyperText Transport Protocol (HTTP) message.

11. The method of claim 10, wherein:
    at least one of the codewords designates whether the message is a request message or a response message.

12. The method of claim 10, wherein:
    at least one of the codewords designates a request line of the message.

13. The method of claim 10, wherein:
    at least one of the codewords designates a status line of the message.

14. The method of claim 10, wherein:
    at least one of the codewords designates a header line of the message.

15. The method of claim 10, wherein:
    at least one of the codewords designates a name/value pair that follow a header identifier in a header line of the message.

16. The method of claim 10, wherein:
    at least one of the codewords designates a method field of the message.

17. The method of claim 10, wherein:
    at least one of the codewords designates a Uniform Resource Locator (URL) field of the message.

18. The method of claim 10, wherein:
    at least one of the codewords designates a protocol version field of the message.

19. The method of claim 10, wherein:
    at least one of the codewords designates a status code and/or status message of the message.

20. The method of claim 10, wherein:
    at least one of the codewords designates a length of at least one subsequent data element of the message.

21. The method of claim 10, wherein:
    at least one of the codewords designates a length of at least one subsequent codeword of the message.

22. The method of claim 10, wherein:
    at least one of the codewords designates a protocol type field of the message.

23. The method of claim 10, wherein:
    at least one of the codewords designates a number of header lines of the message.

24. The method of claim 10, wherein:
    at least one of the codewords designates a header type of a header line of the message.

25. An apparatus for processing a digital protocol message which includes a plurality of recognizable data elements and data other than the recognizable data elements, comprising:
    (a) means for providing a plurality of codewords for coding a corresponding plurality of recognizable data elements of the protocol;

each of said recognizable data elements comprising a string having a plurality of characters;

(b) a parser for parsing the digital protocol message to locate data elements thereof corresponding to said recognizable data elements and to locate said other data;

(c) means for outputting a corresponding one of said codewords for each of the recognizable data elements located in the digital protocol message to provide the message in a compressed format;

(d) a coder for coding the other data to provide coded data; and (e) a combiner for combining the coded data with the codewords in the compressed message.

26. A method for processing a digital protocol message that is in a compressed format, and which includes: (1) codewords that represent recognizable data elements of the protocol and (2) data other than said codewords, wherein each of said recognizable data elements comprises a string having a plurality of characters, comprising the steps of:

(a) providing a plurality of data elements of the protocol for decoding a corresponding plurality of the codewords;

(b) parsing the compressed message to locate the codewords thereof and the other data contained therein;

(c) providing the respective data elements for each corresponding codeword located in said step (b) to provide the digital protocol message in an uncompressed format; and (d) combining the other data located in said step (b) with said data elements provided in said step (c) to provide the digital protocol message in the uncompressed format.

27. The method of claim 26, comprising the further step of:

(e) handling the uncompressed digital protocol message obtained in said step (d) in accordance with the protocol.

28. An apparatus for processing a digital protocol message that is in a compressed format, and which includes: (1) codewords that represent recognizable data elements of the protocol and (2) data other than said codewords, wherein each of said recognizable data elements comprises a string having a plurality of characters, comprising:

(a) means for providing a plurality of data elements of the protocol for decoding a corresponding plurality of the codewords;

(b) a parser for parsing the compressed message to locate the codewords thereof and the other data contained therein;

(c) means for providing the respective data elements for each corresponding codeword located by said parser to provide the digital protocol message in an uncompressed format; and (d) a combiner for combining the other data located by said parser with said data elements provided by said means (c) to provide the digital protocol message in the uncompressed format.

29. The apparatus of claim 28, further comprising:

a message handler for handling the uncompressed digital protocol message in accordance with the protocol.

30. A method for processing a digital protocol message that is in a compressed format, and which includes: (1) codewords that represent recognizable data elements of the protocol, wherein each of said recognizable data elements comprises a string having a plurality of characters and (2) data other than said codewords, comprising the steps of:

(a) parsing the compressed message to locate the codewords thereof and the other data contained therein;

(b) providing the codewords located in said step (a) to a compressed protocol data message handler for processing thereat in accordance with the protocol without recovering the corresponding data elements; and (c) providing the other data located in said step (c) to the compressed protocol data message handler for processing thereat in accordance with the protocol.

31. An apparatus for processing a digital protocol message that is in a compressed format, and which includes: (1) codewords that represent recognizable data elements of the protocol and (2) data other than said codewords, wherein each of said recognizable data elements comprises a string having a plurality of characters, comprising:

(a) a parser for parsing the compressed message to locate the codewords thereof and the other data contained therein;

(b) means for providing the codewords located by said parser to a compressed protocol data message handler for processing thereat without recovering the corresponding data elements in accordance with the protocol; and (c) means for providing the other data located by the parser to the compressed protocol data message handler for processing thereat in accordance with the protocol.

* * * * *